US009660591B2

United States Patent
Takenaka

(10) Patent No.: US 9,660,591 B2
(45) Date of Patent: May 23, 2017

(54) POWER AMPLIFIER

(71) Applicant: Murata Manufacturing Co., Ltd., Kyoto (JP)

(72) Inventor: Kiichiro Takenaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/792,902

(22) Filed: Jul. 7, 2015

(65) Prior Publication Data

US 2016/0013761 A1 Jan. 14, 2016

(30) Foreign Application Priority Data

Jul. 10, 2014 (JP) ................. 2014-142433

(51) Int. Cl.
| | |
|---|---|
| *H03F 3/68* | (2006.01) |
| *H03F 1/02* | (2006.01) |
| *H03F 1/56* | (2006.01) |
| *H03F 3/195* | (2006.01) |
| *H03F 3/24* | (2006.01) |
| *H03F 3/72* | (2006.01) |

(52) U.S. Cl.
CPC ......... *H03F 1/0288* (2013.01); *H03F 1/0277* (2013.01); *H03F 1/56* (2013.01);
(Continued)

(58) Field of Classification Search
CPC ........ H03F 1/0288; H03F 1/0277; H03F 1/56; H03F 3/195; H03F 3/245; H03F 3/72;
(Continued)

(56) References Cited

U.S. PATENT DOCUMENTS

| | | | |
|---|---|---|---|
| 5,568,086 A | 10/1996 | Schuss et al. | |
| 7,382,186 B2 * | 6/2008 | Apel | ..................... H03F 1/0277 330/124 R |

(Continued)

FOREIGN PATENT DOCUMENTS

| | | |
|---|---|---|
| JP | H08-330873 A | 12/1996 |
| JP | 2000-165311 A | 6/2000 |

(Continued)

OTHER PUBLICATIONS

Office Action issued in Japanese Patent Application No. 2014-142433 dated Jan. 13, 2017.

*Primary Examiner* — Steven J Mottola
*Assistant Examiner* — Hafizur Rahman
(74) *Attorney, Agent, or Firm* — Pearne & Gordon LLP

(57) ABSTRACT

A power amplifier includes a power splitter that splits a first signal into a second signal and a third signal delayed from the second signal by about 90°, a first amplifier that outputs a fourth signal by amplifying the second signal when a power level of the first signal equals/exceeds a first level, a second amplifier that outputs a fifth signal by amplifying the third signal when the power level of the first signal equals/exceeds a second level higher than the first level, a first phase shifter that receives the fourth signal and outputs a sixth signal delayed from the fourth signal by about 45°, a second phase shifter that receives the fifth signal and outputs a seventh signal advanced from the fifth signal by about 45°, and a combining unit that outputs an amplified signal of the first signal by combining the sixth and seventh signals.

7 Claims, 7 Drawing Sheets

(52) U.S. Cl.
CPC .............. *H03F 3/195* (2013.01); *H03F 3/245* (2013.01); *H03F 3/72* (2013.01); *H03F 2200/222* (2013.01); *H03F 2200/387* (2013.01); *H03F 2200/391* (2013.01); *H03F 2200/451* (2013.01); *H03F 2203/7215* (2013.01); *H03F 2203/7236* (2013.01)

(58) Field of Classification Search
CPC ......... H03F 2200/222; H03F 2200/387; H03F 2200/391; H03F 2200/451; H03F 2203/7215; H03F 2203/7236
USPC ............ 330/107, 124 R, 269, 277, 286, 295; 333/32, 33, 124, 125; 455/127
See application file for complete search history.

(56) References Cited

U.S. PATENT DOCUMENTS

| | | |
|---|---|---|
| 2006/0139091 A1 | 6/2006 | Fratti |
| 2007/0139105 A1* | 6/2007 | Kennan ................. H03F 1/0211 330/124 R |
| 2011/0025412 A1 | 2/2011 | Matsunaga |
| 2011/0210786 A1* | 9/2011 | Blednov ............... H03F 1/0288 330/124 R |
| 2012/0235734 A1* | 9/2012 | Pengelly ............... H03F 1/0288 330/124 D |
| 2014/0152389 A1* | 6/2014 | Hamparian ............ H03F 3/211 330/295 |

FOREIGN PATENT DOCUMENTS

| | | |
|---|---|---|
| JP | 2006-333022 A | 5/2006 |
| JP | 2006-191581 A | 7/2006 |
| JP | 2010-041588 A | 2/2010 |
| JP | 2010-135961 A | 6/2010 |
| JP | 2012-213180 A | 11/2012 |
| JP | 2014-511166 A | 5/2014 |
| WO | 2009-131138 A1 | 10/2009 |

* cited by examiner

US 9,660,591 B2

POWER AMPLIFIER

BACKGROUND

Field

The present disclosure relates to a power amplifier.

Description of the Related Art

As a high-efficiency power amplifier, a Doherty amplifier is disclosed, for example, in Japanese Unexamined Patent Application Publication No. 8-330873. As disclosed in the publication, a Doherty amplifier includes a carrier amplifier and a peak amplifier connected in parallel. The carrier amplifier operates irrespective of the power level of the input signal. The peak amplifier is off when at a low power level of the input signal and operates at a high power level of the input signal. In such a Doherty amplifier, a λ/4 transmission line is commonly adopted on the output side of the carrier amplifier to change the load impedance of the carrier amplifier in accordance with the operating state of the peak amplifier.

SUMMARY

As described above, the Doherty amplifier has drawn attention as a high-efficiency amplifier. A common Doherty amplifier, however, is unsuitable for being mounted in a small electronic device such as a cellular phone due to a large circuit size of the λ/4 transmission line.

The present disclosure has been made in view of the above circumstances, and it provides a power amplifier capable of realizing high efficiency and a reduction in size.

A power amplifier according to an aspect of the present disclosure includes a power splitter, a first amplifier, a second amplifier, a first phase shifter, a second phase shifter, and a combining unit. The power splitter splits a first signal into a second signal and a third signal delayed from the second signal by about 90 degrees. The first amplifier outputs a fourth signal by amplifying the second signal when a power level of the first signal equals or exceeds a first level. The second amplifier outputs a fifth signal by amplifying the third signal when the power level of the first signal equals or exceeds a second level higher than the first level. The first phase shifter receives an input of the fourth signal and outputs a sixth signal delayed from the fourth signal by about 45 degrees. The second phase shifter receives an input of the fifth signal and outputs a seventh signal advanced from the fifth signal by about 45 degrees. The combining unit outputs an amplified signal of the first signal by combining the sixth signal and the seventh signal.

According to the present disclosure, a power amplifier capable of realizing high efficiency and a reduction in size is provided.

Other features, elements, characteristics, and advantages of the present disclosure will become more apparent from the following detailed description of embodiments of the present disclosure with reference to the attached drawings.

BRIEF DESCRIPTION OF THE DRAWINGS

FIG. 4 is a diagram illustrating a state in which the carrier amplifier and the peak amplifier are both on;

DESCRIPTION OF THE EMBODIMENTS

Figure 1:
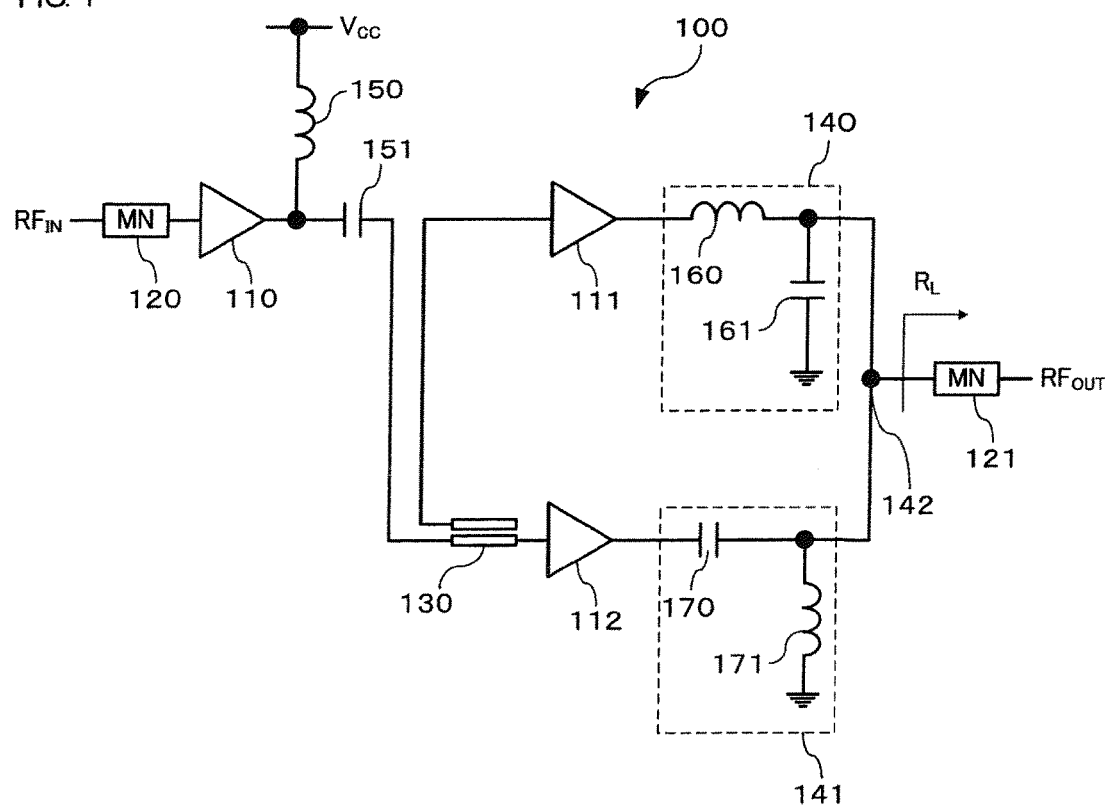
FIG. 1 is a diagram illustrating a configuration example of a power amplifier as an embodiment of the present disclosure.

With reference to the drawings, an embodiment of the present disclosure will be described below. FIG. 1 is a diagram illustrating a configuration example of a power amplifier as an embodiment of the present disclosure. A power amplifier 100 is mounted in a cellular phone, for example, and used to amplify the power of a signal that is transmitted to a base station. The power amplifier 100 includes an initial-stage amplifier 110, a carrier amplifier 111, a peak amplifier 112, matching networks (MNs) 120 and 121, a coupled-line 3 dB coupler (hereinafter simply referred to as "3 dB coupler") 130, phase shifters 140 and 141, a combining unit 142, an inductor 150, and a capacitor 151. The power amplifier 100 may be formed on a single IC chip or multiple IC chips.

The initial-stage amplifier 110 (a third amplifier) amplifies a radio frequency (RF) signal $RF_{IN}$ (an input signal) input via the matching network 120, and outputs an amplified signal (a first signal). The frequency of the signal $RF_{IN}$ is about a few gigahertz, for example.

The carrier amplifier 111, the peak amplifier 112, the 3 dB coupler 130, the phase shifters 140 and 141, and the combining unit 142 form a second-stage amplifier circuit which amplifies the signal output from the initial-stage amplifier 110 (the first signal), and which is similar in configuration to a common Doherty amplifier.

The 3 dB coupler 130 (a power splitter) splits the signal output from the initial-stage amplifier 110 (the first signal) into a signal to the carrier amplifier 111 (a second signal) and a signal to the peak amplifier 112 (a third signal). The phase of the signal to the peak amplifier 112 is delayed from the phase of the signal to the carrier amplifier 111 by about 90 degrees.

The carrier amplifier 111 (a first amplifier) amplifies the signal input thereto (the second signal), and outputs an amplified signal (a fourth signal). Further, the peak amplifier 112 (a second amplifier) amplifies the signal input thereto (the third signal), and outputs an amplified signal (a fifth signal).

Figure 2:
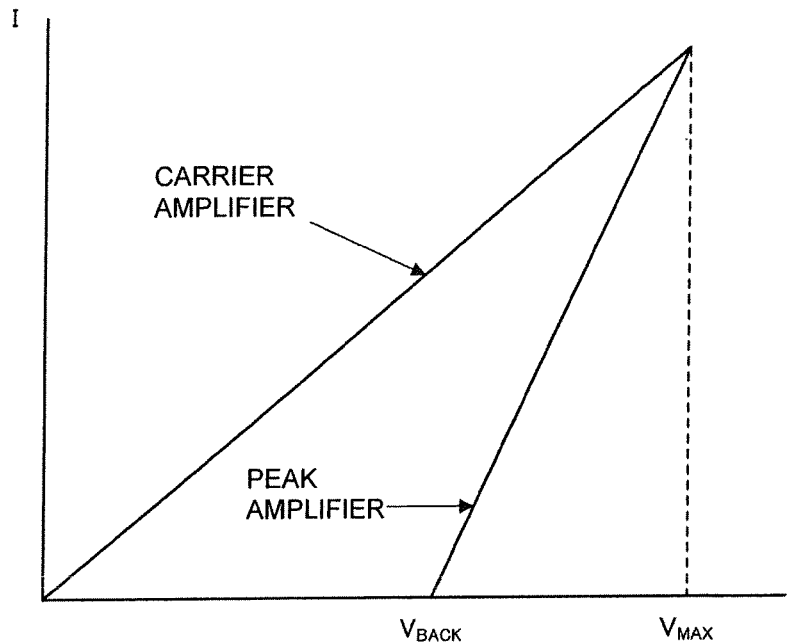
FIG. 2 is characteristics illustrating an example of operating characteristics of a carrier amplifier and a peak amplifier.

FIG. 2 is characteristics illustrating an example of operating characteristics of the carrier amplifier 111 and the peak amplifier 112. In FIG. 2, the horizontal axis represents the voltage of the signal $RF_{IN}$, and the vertical axis represents the current flowing through the respective amplifiers. Meanwhile, the peak amplifier 112 operates when the voltage level of the signal $RF_{IN}$ equals or exceeds a level $V_{BACK}$, which is lower than a maximum level $V_{MAX}$ by a predetermined value. That is, the peak amplifier 112 operates when the power level of the signal $RF_{IN}$ equals or exceeds a level (a second level) lower than a maximum level by a predetermined value (6 dB, for example).

The phase shifter 140 (a first phase shifter) includes an inductor 160 (a first inductor) and a capacitor 161 (a second capacitor). The inductor 160 is connected in series between the carrier amplifier 111 and the combining unit 142. The capacitor 161 has one end electrically connected to the combining unit 142 and the other end grounded. The phase shifter 140 outputs a signal (a sixth signal), and the phase of which is delayed from the phase of the signal output from the carrier amplifier 111 (the fourth signal) by about 45 degrees. In the present embodiment, the inductance of the inductor 160 is set to $L=R_L/\omega$. Further, in the present embodiment, the capacitance of the capacitor 161 is set to $C=1/(2R_L\omega)$. Herein, $R_L$ represents the impedance from the combining unit 142 to the matching network 121, and $\omega$ represents the angular frequency corresponding to the center frequency of the signal $RF_{IN}$. The principle of phase conversion in the phase shifter 140 will be described later.

The phase shifter 141 (a second phase shifter) includes a capacitor 170 (a first capacitor) and an inductor 171 (a second inductor). The capacitor 170 is connected in series between the peak amplifier 112 and the combining unit 142. The inductor 171 has one end electrically connected to the combining unit 142 and the other end grounded. The phase shifter 141 outputs a signal (a seventh signal), and the phase of which is advanced from the phase of the signal output from the peak amplifier 112 (the fifth signal) by about 45 degrees. In the present embodiment, the capacitance of the capacitor 170 is set to $C=1/(R_L\omega)$. Further, in the present embodiment, the inductance of the inductor 171 is set to $L=2R_L/\omega$. The principle of phase conversion in the phase shifter 141 will be described later.

The combining unit 142 outputs a combined signal of the signal output from the phase shifter 140 (the sixth signal) and the signal output from the phase sifter 141 (the seventh signal) via the matching network 121 as an amplified signal $RF_{OUT}$ of the signal $RF_{IN}$.

Figure 3:
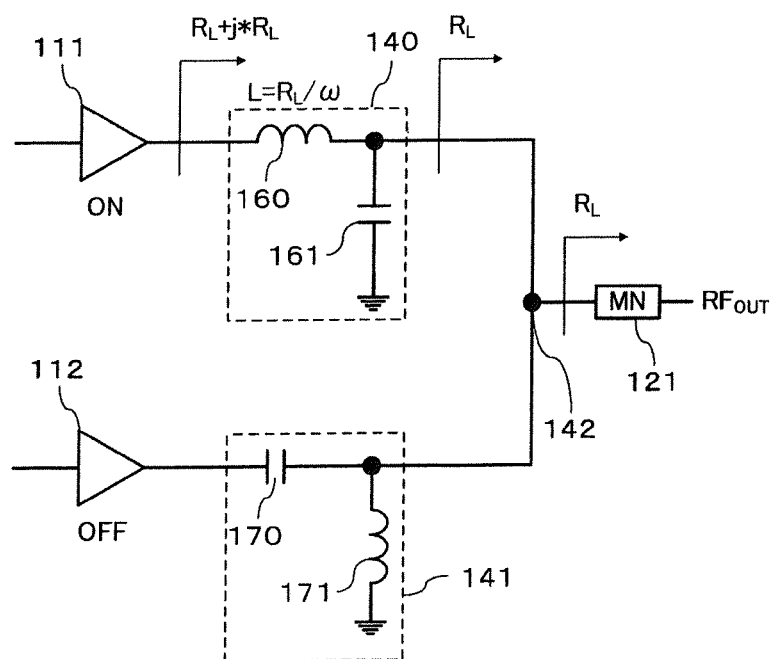
FIG. 3 is a diagram illustrating a state in which the carrier amplifier is on and the peak amplifier is off.

FIG. 3 is a diagram illustrating a state in which the carrier amplifier 111 is on and the peak amplifier 112 is off, that is, the signal $RF_{IN}$ is lower than the level $V_{BACK}$. Since the peak amplifier 112 is off in this case, the impedance on the output side of the peak amplifier 112 is ideally open. As described later, the capacitor 161 and the inductor 171 are omissible. When $R_L$ represents the impedance on the load side (on the side of the matching network 121) viewed from the combining unit 142 and the capacitor 161 and the inductor 171 are ignored, therefore, the load-side impedance viewed from the output of the inductor 160 is also $R_L$. Accordingly, the load-side impedance viewed from the output of the carrier amplifier 111 is expressed as $R_L+j\omega\times(R_L/\omega)=R_L+j\times R_L$.

Figure 4:
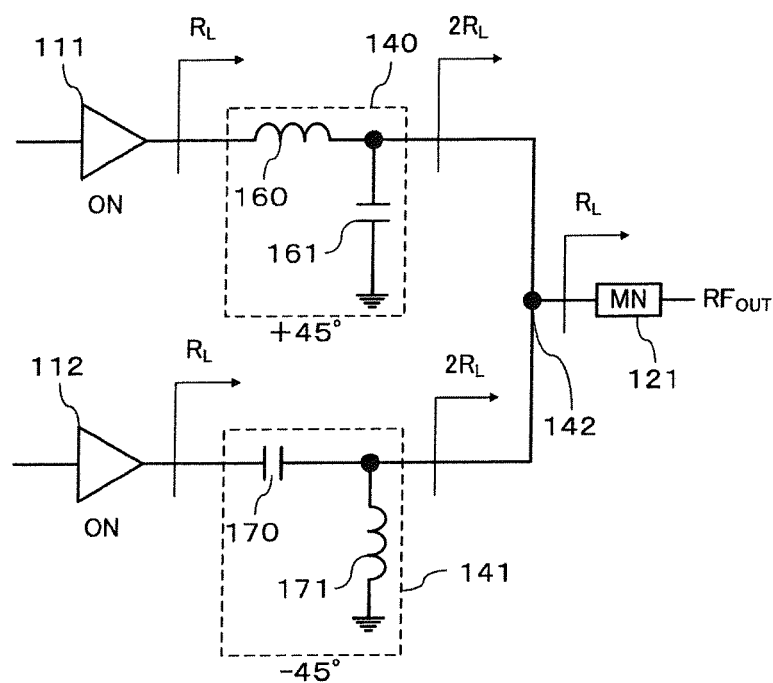

FIG. 4 is a diagram illustrating a state in which the carrier amplifier 111 and the peak amplifier 112 are both on and an equal current flows therethrough, that is, the signal $RF_{IN}$ is at the maximum level $V_{MAX}$. In this case, the peak amplifier 112 is on, and the same current as that in the carrier amplifier 111 flows through the peak amplifier 112. When $R_L$ represents the impedance on the load side (on the side of the matching network 121) viewed from the combining unit 142, therefore, the load-side impedance viewed from the output of the phase shifter 140 and the load-side impedance viewed from the output of the phase shifter 141 are both $2R_L$ with the power splitting of the load-side impedance $R_L$. That is, since the phase shifters 140 and 141 are connected in parallel, the combined impedance of the phase shifters 140 and 141 needs to be $2R_L$, twice the load-side impedance $R_L$, in order to match the combined impedance and the load-side impedance $R_L$. In this state, the phase shifter 140 delays the phase by about 45 degrees, and performs impedance conversion between the load-side impedance ($R_L$) viewed from the output of the carrier amplifier 111 and the load-side impedance ($2R_L$) viewed from the output of the phase shifter 140. Further, the phase shifter 141 advances the phase by about 45 degrees, and performs impedance conversion between the load-side impedance ($R_L$) viewed from the output of the peak amplifier 112 and the load-side impedance ($2R_L$) viewed from the output of the phase shifter 141. The principle of phase conversion and impedance conversion will be described below.

Figure 5:
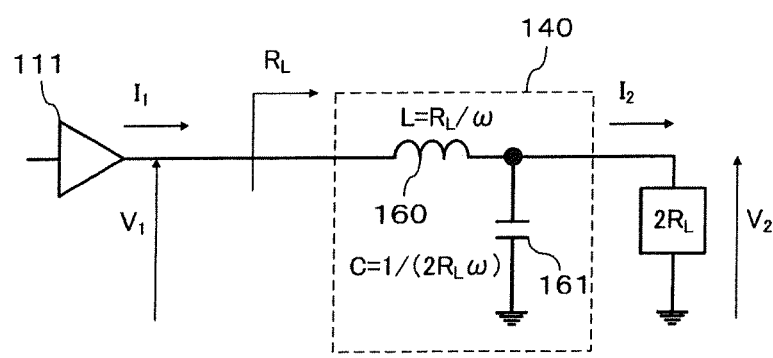
FIG. 5 is a diagram illustrating a path on the side of the carrier amplifier in the state of FIG. 4.

FIG. 5 is a diagram illustrating a path on the side of the carrier amplifier 111 in the state of FIG. 4. Herein, $V_1$ and $I_1$ respectively represent the voltage and the current on the input side of the phase shifter 140, and $V_2$ and $I_2$ respectively represent the voltage and the current on the output side of the phase shifter 140. Since the load-side impedance viewed from the output of the phase shifter 140 is $2R_L$, the current $I_2$ is expressed by the following equation.

$$I_2 = \frac{V_2}{2R_L} \quad \text{[Math. 1]}$$

Further, the current $I_1$ is expressed by the following equation.

$$I_1 = I_2 + \frac{V_2}{\dfrac{1}{j\omega\dfrac{1}{2R_L\omega}}} = \frac{V_2}{2R_L}(1+j) = (1+j)I_2 \quad \text{[Math. 2]}$$

Further, the voltage $V_1$ is expressed by the following equation.

$$V_1 = V_2 + I_1 j\omega \frac{R_L}{\omega} = V_2 + \frac{j-1}{2}V_2 = \frac{1+j}{2}V_2 \quad \text{[Math. 3]}$$

The above equation reveals that the phase of the voltage $V_2$ is delayed from the phase of the voltage $V_1$ by about 45 degrees.

Further, the load-side impedance viewed from the output of the carrier amplifier 111 is expressed by the following equation.

$$\frac{V_1}{I_1} = \frac{\frac{1+j}{2}V_2}{(1+j)I_2} = \frac{1}{2} \cdot \frac{V_2}{I_2} = \frac{1}{2} \cdot 2R_L = R_L \quad \text{[Math. 4]}$$

The above equation reveals that the load-side impedance viewed from the output of the carrier amplifier 111 is $R_L$.

Figure 6:
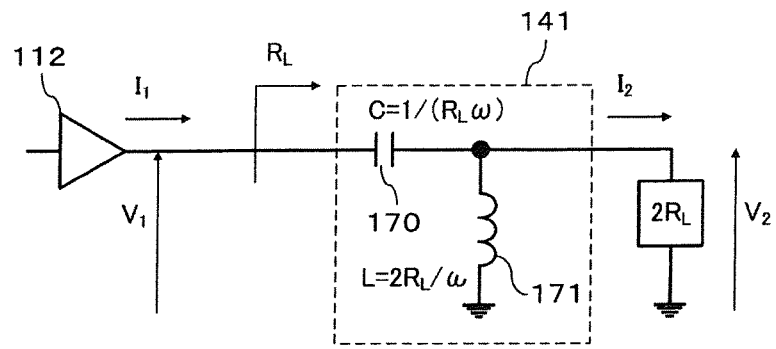
FIG. 6 is a diagram illustrating a path on the side of the peak amplifier in the state of FIG. 4.

FIG. 6 is a diagram illustrating a path on the side of the peak amplifier 112 in the state of FIG. 4. Herein, $V_1$ and $I_1$ respectively represent the voltage and the current on the input side of the phase shifter 141, and $V_2$ and $I_2$ respectively represent the voltage and the current on the output side of the phase shifter 141. Since the load-side impedance viewed from the output of the phase shifter 141 is $2R_L$, the current $I_2$ is expressed by the following equation.

$$I_2 = \frac{V_2}{2R_L} \quad \text{[Math. 5]}$$

Further, the current $I_1$ is expressed by the following equation.

$$I_1 = I_2 + \frac{V_2}{j\omega\frac{2R_L}{\omega}} = \frac{V_2}{2R_L}(1-j) = (1-j)I_2 \quad \text{[Math. 6]}$$

Further, the voltage $V_1$ is expressed by the following equation.

$$V_1 = V_2 + I_1 \frac{1}{j\omega\frac{1}{R_L\omega}} = V_2 - \frac{j+1}{2}V_2 = \frac{1-j}{2}V_2 \quad \text{[Math. 7]}$$

The above equation reveals that the phase of the voltage $V_2$ is advanced from the phase of the voltage $V_1$ by about 45 degrees.

Further, the load-side impedance viewed from the output of the peak amplifier 112 is expressed by the following equation.

$$\frac{V_1}{I_1} = \frac{\frac{1-j}{2}V_2}{(1-j)I_2} = \frac{1}{2} \cdot \frac{V_2}{I_2} = \frac{1}{2} \cdot 2R_L = R_L \quad \text{[Math. 8]}$$

The above equation reveals that the load-side impedance viewed from the output of the peak amplifier 112 is $R_L$.

According to the power amplifier 100 having such a configuration, only the carrier amplifier 111 operates when the power level of the signal $RF_{IN}$ is relatively low (lower than a back-off level of about 6 dB, for example). Further, the carrier amplifier 111 and the peak amplifier 112 both operate when the power level of the signal $RF_{IN}$ is relatively high (equal to or higher than a back-off level of about 6 dB, for example). Moreover, in the power amplifier 100, the phase shifters 140 and 141 are capable of realizing functions equivalent to those of a λ/4 transmission line of a common Doherty amplifier.

Figure 7:
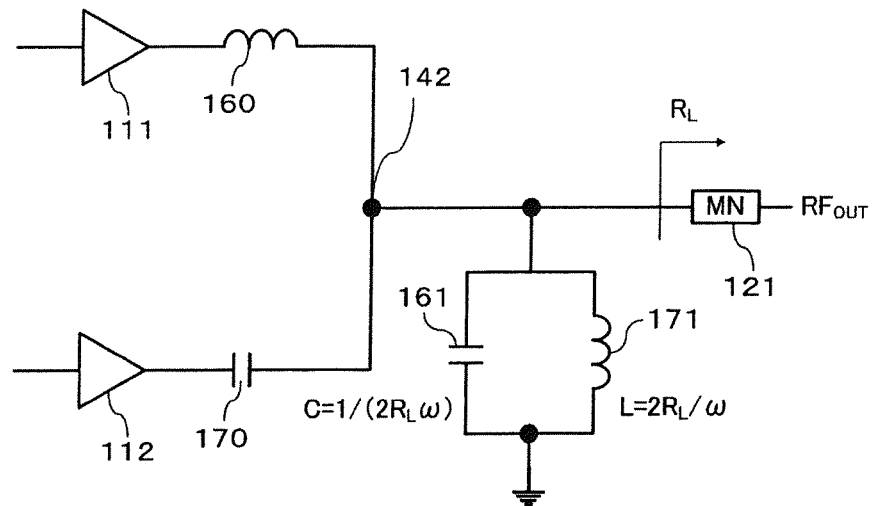
FIG. 7 is a diagram for illustrating that a parallel circuit formed of a grounded capacitor and a grounded inductor is omissible.

A description will now be given that the capacitor 161 of the phase shifter 140 and the inductor 171 of the phase shifter 141 are omissible. As illustrated in FIG. 7, it is possible to view the capacitor 161 and the inductor 171 as a parallel circuit having one end connected to the combining unit 142 and the other end grounded. A combined impedance $Z_{LC}$ of the capacitor 161 and the inductor 171 is expressed by the following equation.

$$Z_{LC} = \frac{j\omega L \cdot \frac{1}{j\omega C}}{j\omega L + \frac{1}{j\omega C}} \quad \text{[Math. 9]}$$

-continued $$= \frac{j\omega\frac{2R_L}{\omega} \cdot \frac{1}{j\omega\frac{1}{2R_L\omega}}}{j\omega\frac{2R_L}{\omega} + \frac{1}{j\omega\frac{1}{2R_L\omega}}}$$

$$= \frac{j2R_L \cdot \frac{2R_L}{j}}{j2R_L + \frac{2R_L}{j}}$$

$$= \frac{4R_L^2}{2R_L(j-j)}$$

$$= \infty$$

Figure 8:
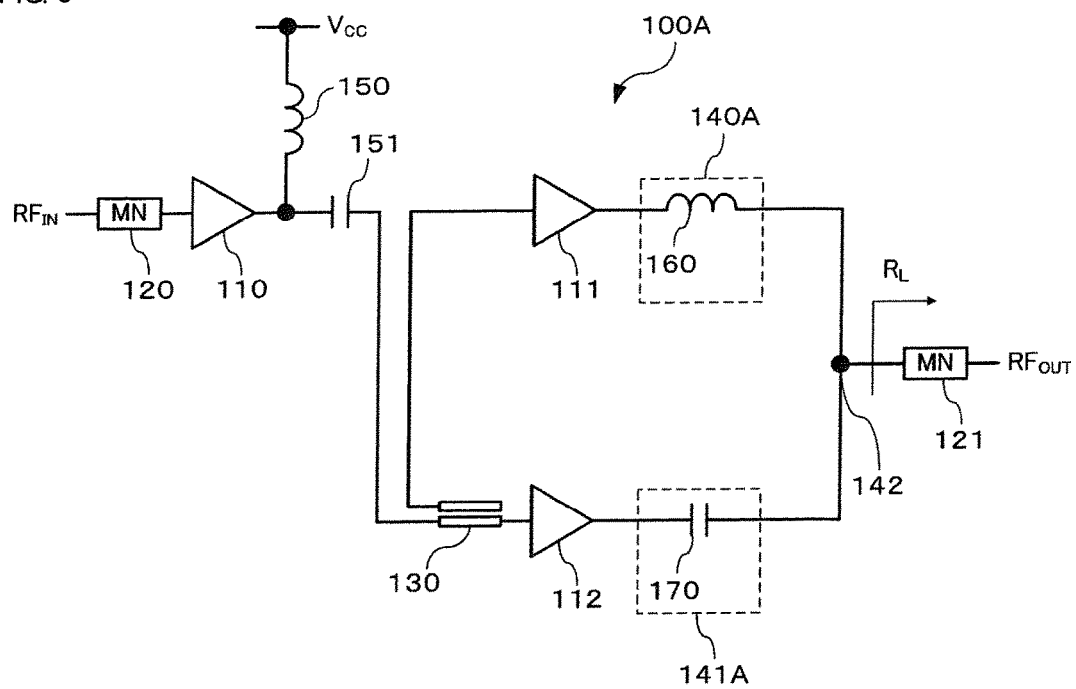
FIG. 8 is a diagram illustrating another example of the configuration of the power amplifier.

As in the above equation, the combined impedance of the capacitor 161 and the inductor 171 becomes infinite with the impedance of each of the capacitor 161 and the inductor 171 set to a predetermined value. Accordingly, the capacitor 161 and the inductor 171 are omissible. FIG. 8 is a diagram illustrating a configuration of a power amplifier 100A, which corresponds to the power amplifier 100 illustrated in FIG. 1 with the capacitor 161 and the inductor 171 omitted therefrom. The same configurations as those of the power amplifier 100 illustrated in FIG. 1 are designated by the same reference numerals, and description thereof will be omitted. As illustrated in FIG. 8, the power amplifier 100A includes a phase shifter 140A not including the capacitor 161 and a phase shifter 141A not including the inductor 171. The functions of the phase shifters 140A and 141A are similar to those of the phase shifters 140 and 141 in the power amplifier 100. The power amplifier 100A may be formed on a single IC chip or multiple IC chips.

Figure 9:
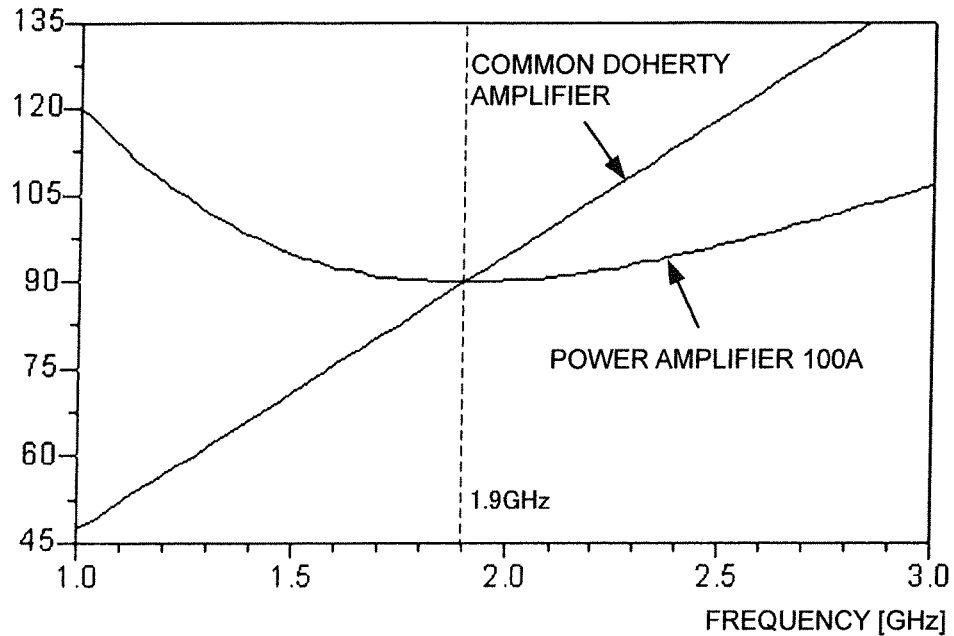
FIG. 9 is characteristics illustrating an example of simulation results of the phase difference between the output of the carrier amplifier and the output of the peak amplifier.

FIG. 9 is a diagram illustrating an example of a simulation result of the phase difference between the output of the carrier amplifier 111 and the output of the peak amplifier 112 obtained in the power amplifier 100A in FIG. 8. FIG. 9 also illustrates, as a comparative example, a simulation result obtained in a common Doherty amplifier including a λ/4 transmission line on the output side of the carrier amplifier 111 in place of the phase shifters 140A and 141A. In FIG. 9, the horizontal axis represents the frequency (GHz), and the vertical axis represents the phase difference (degrees). In the example illustrated in FIG. 9, the power amplifier 100A and the common Doherty amplifier are both designed such that the phase difference is about 90 degrees when the frequency of the signal $RF_{IN}$ is about 1.9 GHz.

As illustrated in FIG. 9, in the common Doherty amplifier, the phase difference varies substantially linearly in accordance with a change in frequency. That is, the rate of change of the phase difference is relatively large near the frequency of 1.9 GHz. Meanwhile, in the power amplifier 100A, the rate of change of the phase difference is relatively small near the frequency of about 1.9 GHz. This is because a change in characteristics of the phase shifter 140A due to a change in frequency is cancelled by a change in characteristics of the phase shifter 141A due to a change in frequency. The simulation results in FIG. 9 therefore reveal that the power amplifier 100A is capable of better handling the signal $RF_{IN}$ having a broad band width than the common Doherty amplifier.

Figure 10A:
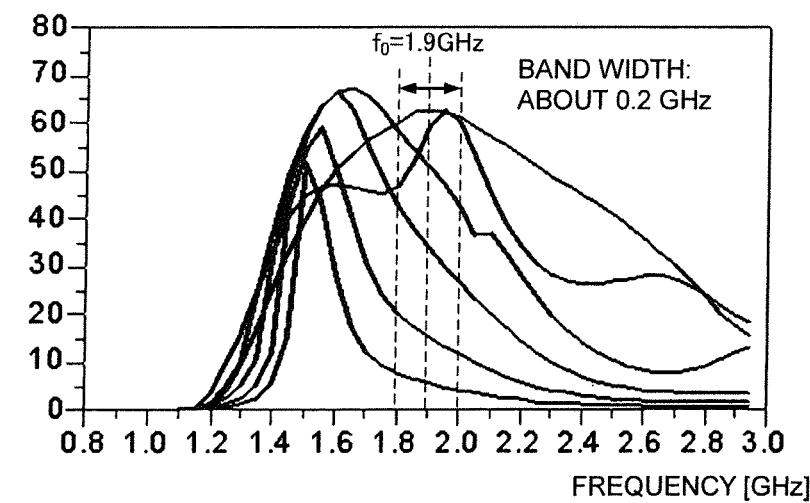
FIG. 10A is characteristics illustrating an example of a simulation result of the power added efficiency obtained in a common Doherty amplifier.
Figure 10B:
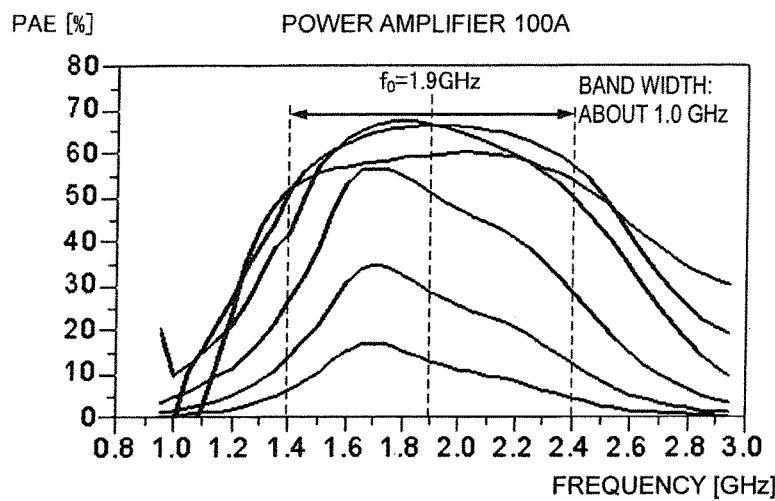
FIG. 10B is characteristics illustrating an example of a simulation result of the power added efficiency obtained in the power amplifier in FIG. 8.

It is also revealed from simulation results of the power added efficiency (PAE) obtained in the common Doherty amplifier and the power amplifier 100A that the power amplifier 100A is capable of handling the signal $RF_{IN}$ having a broad band width. FIGS. 10A and 10B are characteristics illustrating an example of simulation results, wherein the horizontal axis represents the frequency (GHz) and the vertical axis represents the PAE (%). FIGS. 10A and 10B illustrate multiple simulation results at different power levels of the signal $RF_{IN}$.

As illustrated in FIG. 10A, in the common Doherty amplifier, the allowable PAE bandwidth is about 0.2 GHz, for example, when the center frequency is about 1.9 GHz. Meanwhile, as illustrated in FIG. 10B, in the power amplifier 100A, the allowable PAE bandwidth is about 1.0 GHz, for example, when the center frequency is about 1.9 GHz. These simulation results also reveal that the power amplifier 100A is capable of better handling the signal $RF_{IN}$ having a broad band width than the common Doherty amplifier.

Although the simulation results illustrated in FIG. 9 and FIG. 10B relate to the power amplifier 100A, it is obvious that similar effects are also obtained in the power amplifier 100.

Figure 11:
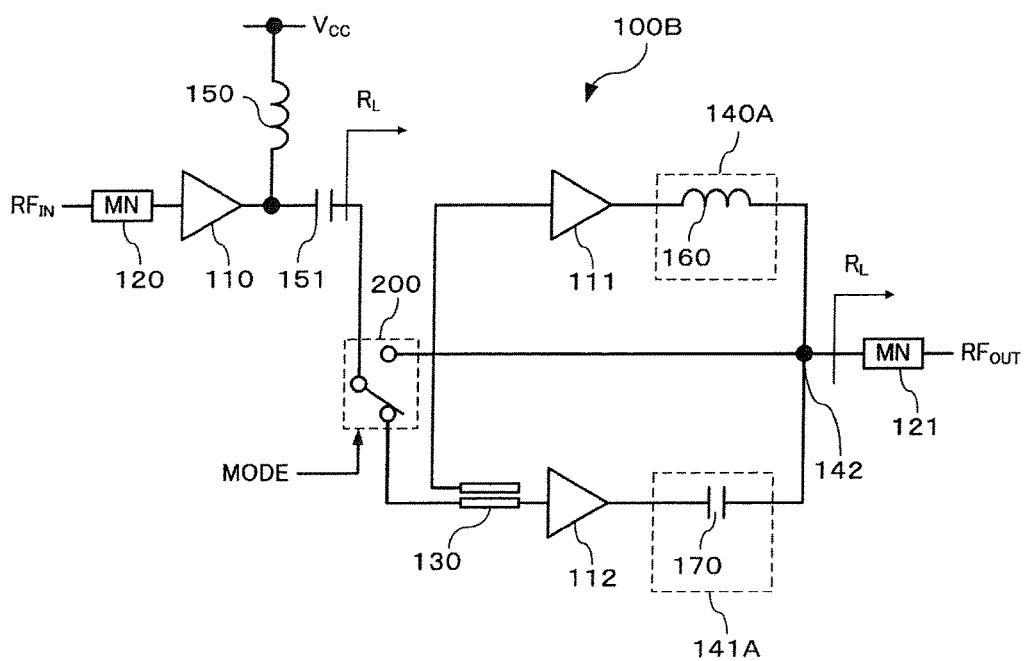
FIG. 11 is a diagram illustrating another example of the configuration of the power amplifier.

FIG. 11 is a diagram illustrating another configuration example of the power amplifier. A power amplifier 100B includes a switch circuit 200 in addition to the configuration of the power amplifier 100A. The same configurations as those of the power amplifier 100A illustrated in FIG. 8 are designated by the same reference numerals, and description thereof will be omitted. The power amplifier 100B may be formed on a single IC chip or multiple IC chips.

The switch circuit 200 selects the path of the signal output from the initial-stage amplifier 110 between the combining unit 142 and the 3 dB coupler 130 in accordance with a power mode signal MODE that controls a power mode (output power) of the power amplifier 100B. Specifically, in a low power mode, for example, the switch circuit 200 switches the signal path such that the signal output from the initial-stage amplifier 110 is connected to the combining unit 142. Further, in a high power mode, for example, the switch circuit 200 selects the signal path such that the signal output from the initial-stage amplifier 110 is connected to the 3 dB coupler 130.

The switch circuit 200 thus provided can skip power amplification according to the power mode. The power amplifier 100B is designed such that the load-side impedance viewed from the capacitor 151 is $R_L$ when the switch circuit 200 is connected to the 3 dB coupler 130. Accordingly, the power amplifier 100B is capable of suppressing impedance fluctuations when the signal path is switched by the switch circuit 200.

The present embodiment has been described above. The power amplifier 100, 100A, or 100B according to the present embodiment is capable of changing the load impedance of the carrier amplifier 111 by turning on and off the operation of the peak amplifier 112 in accordance with the power level of the signal $RF_{IN}$, similarly to the common Doherty amplifier. Accordingly, the power amplifier 100, 100A, or 100B according to the present embodiment is capable of performing high-efficiency power amplification similarly to the common Doherty amplifier. Further, the power amplifier 100, 100A, or 100B according to the present embodiment employs the phase shifters 140 (140A) and 141 (141A), which include an inductor and a capacitor, respectively, in place of the λ/4 transmission line of the common Doherty amplifier. Accordingly, the power amplifier 100, 100A, or 100B according to the present embodiment is capable of realizing a reduction in size, as compared with the common Doherty amplifier.

Further, in the power amplifier 100A or 100B according to the present embodiment, the capacitor 161 of the phase shifter 140 and the inductor 171 of the phase shifter 141 are omitted. It is thereby possible to further reduce the circuit size.

Further, in the power amplifier 100, 100A, or 100B according to the present embodiment, the 3 dB coupler 130 is employed as a power splitter that splits signals to the carrier amplifier 111 and the peak amplifier 112. The 3 dB coupler 130 has a small dimension and is formable on a chip, and thus is capable of reducing the circuit size of the power amplifier 100, 100A, or 100B.

Any given power splitter other than the 3 dB coupler 130 may also be employed. For example, a combination of a Wilkinson divider and a phase shifter or a branch-line (hybrid) may be employed as the power splitter.

Further, the power amplifier 100B according to the present embodiment is capable of causing the signal output from the initial-stage amplifier 110 to be input to the combining unit 142 or the 3 dB coupler 130 based on the power mode signal. Accordingly, it is possible to perform power amplification according to the power mode.

Further, it is possible to configure the power amplifier 100, 100A, or 100B according to the present embodiment on a single IC chip.

While embodiments of the disclosure have been described above, it is to be understood that the present embodiment is for facilitating understanding of the present disclosure and not for limiting interpretation of the present disclosure. It is also to be understood that variations, modifications, and improvements will be apparent to those skilled in the art without necessarily departing from the scope and spirit of the disclosure, and that the present disclosure includes equivalents thereof. The scope of the disclosure, therefore, is to be determined solely by the following claims.

What is claimed is:
1. A power amplifier comprising:
a power splitter that splits a first signal into a second signal and a third signal delayed from the second signal by about 90 degrees, wherein the power splitter includes a coupled-line 3 dB coupler;
a first amplifier that outputs a fourth signal by amplifying the second signal when a power level of the first signal equals or exceeds a first level;
a second amplifier that outputs a fifth signal by amplifying the third signal when the power level of the first signal equals or exceeds a second level higher than the first level;
a first phase shifter that receives an input of the fourth signal and outputs a sixth signal delayed from the fourth signal by about 45 degrees;
a second phase shifter that receives an input of the fifth signal and outputs a seventh signal advanced from the fifth signal by about 45 degrees; and
a combining unit that outputs an amplified signal of the first signal by combining the sixth signal and the seventh signal,
wherein the power splitter, the first amplifier, the second amplifier, the first phase shifter, the second phase shifter, and the combining unit are provided on a single IC chip.
2. The power amplifier according to claim 1, wherein the first phase shifter includes a first inductor connected in series between the first amplifier and the combining unit, and
wherein the second phase shifter includes a first capacitor connected in series between the second amplifier and the combining unit.

3. The power amplifier according to claim 2, wherein the first phase shifter further includes a second capacitor having one end electrically connected to the combining unit and an other end grounded, and wherein the second phase shifter further includes a second inductor having one end electrically connected to the combining unit and an other end grounded.

4. The power amplifier according to claim 1, further comprising a third amplifier that outputs the first signal by amplifying an input signal.

5. The power amplifier according to claim 4, further comprising a switch that connects the first signal to the power splitter or the combining unit based on a power mode signal that controls output power.

6. The power amplifier according to claim 2, further comprising a third amplifier that outputs the first signal by amplifying an input signal.

7. The power amplifier according to claim 3, further comprising a third amplifier that outputs the first signal by amplifying an input signal.

* * * * *